(12) United States Patent
Bhatia et al.

(10) Patent No.: US 10,707,899 B2
(45) Date of Patent: Jul. 7, 2020

(54) BIT-FLIPPING DECODER FOR G-LDPC CODES WITH SYNDROME-DECODING FOR COMPONENT CODES

(71) Applicant: SK Hynix Inc., Gyeonggi-do (KR)

(72) Inventors: Aman Bhatia, San Jose, CA (US); Naveen Kumar, San Jose, CA (US); Chenrong Xiong, San Jose, CA (US); Fan Zhang, Fremont, CA (US); Xuanxuan Lu, San Jose, CA (US); Yu Cai, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/917,222

(22) Filed: Mar. 9, 2018

(65) Prior Publication Data

US 2019/0068219 A1   Feb. 28, 2019

Related U.S. Application Data

(60) Provisional application No. 62/553,008, filed on Aug. 31, 2017.

(51) Int. Cl.
*H03M 13/11*     (2006.01)
*G11C 29/42*     (2006.01)
*G06F 11/10*     (2006.01)

(52) U.S. Cl.
CPC ..... *H03M 13/1108* (2013.01); *G06F 11/1012* (2013.01); *G11C 29/42* (2013.01); *H03M 13/1174* (2013.01); *H03M 13/1111* (2013.01)

(58) Field of Classification Search
CPC .......... H03M 13/152; H03M 13/1545; H03M 13/1525; H03M 13/1575; H03M 13/153;
(Continued)

(56) References Cited

U.S. PATENT DOCUMENTS 7,028,247 B2 *   4/2006   Lee .................. G06F 7/724
                                                  714/784
8,055,977 B2 *  11/2011   Ito .................. G11B 20/1803
                                                  714/758

(Continued)

OTHER PUBLICATIONS

Pyndiah, R.M., "Near-optimum decoding of product codes: block turbo codes," in IEEE Transactions on Communications, vol. 46 No. 8, pp. 1003-1010, Aug. 1998.

*Primary Examiner* — James C Kerveros
(74) *Attorney, Agent, or Firm* — Kilpatrick Townsend & Stockton LLP

(57) ABSTRACT

Techniques are described for performing a bit-flipping decoding scheme on a G-LDPC codeword. In an example, a decoding system uses two syndrome tables. The first syndrome table identifies a predefined syndrome for a component codeword that protects a bit of the G-LDPC codeword. This predefined syndrome is identified based on a location of the bit and is used to update a current syndrome of the component codeword. The second syndrome table identifies one or more bit error locations for the component codeword. The bit error locations are identified from the second syndrome table based on the current syndrome of the component codeword, as updated. In an example, the error locations are used to update a reliability of the bit if its location corresponds to one of the error locations. A bit flipping decision is made for the bit based on its reliability.

20 Claims, 9 Drawing Sheets

(58) Field of Classification Search
CPC ........... H03M 13/617; H03M 13/1108; H03M 13/1174; H03M 13/1111; G11C 29/42; G06F 11/1012
USPC ........................................................ 714/785
See application file for complete search history.

(56) References Cited

U.S. PATENT DOCUMENTS

| | | | | |
|---|---|---|---|---|
| 8,301,987 | B2* | 10/2012 | Dror | H03M 13/152 |
| | | | | 714/773 |
| 8,683,293 | B2* | 3/2014 | Saxena | H03M 13/1575 |
| | | | | 714/759 |
| 9,369,152 | B2 | 6/2016 | Nguyen et al. | |
| 2010/0199156 | A1* | 8/2010 | Yang | H03M 13/152 |
| | | | | 714/785 |
| 2013/0179748 | A1* | 7/2013 | Dong | G06F 11/1012 |
| | | | | 714/755 |
| 2015/0280745 | A1* | 10/2015 | Cho | H03M 13/617 |
| | | | | 714/785 |
| 2016/0182087 | A1* | 6/2016 | Sommer | H03M 13/1148 |
| | | | | 714/752 |
| 2017/0063400 | A1 | 3/2017 | Zhang et al. | |
| 2018/0278273 | A1* | 9/2018 | Kifune | H03M 13/2927 |
| 2019/0042360 | A1* | 2/2019 | Song | G06F 11/1068 |
| 2019/0081730 | A1* | 3/2019 | Oveis Gharan | H03M 13/6312 |
| 2019/0087265 | A1* | 3/2019 | Kifune | G06F 11/1068 |

\* cited by examiner

310

| Global Location in G-LDPC Codeword | Local Location in Component Codeword | Predefined Syndrome |
|---|---|---|
| 1 | 1 | 1 0 0 0 0 0 0 |
| 30 | 2 | 0 1 0 0 0 0 0 |
| ... | ... | ... |
| 8,568 | 128 | 0 1 0 1 0 0 1 |

320

| Predefined Syndrome | Local Error Location(s) in Component Codeword | Global Error Location(s) in G-LDPC Codeword |
|---|---|---|
| 1 0 0 0 0 0 0 | 1 | 1 |
| 0 1 0 0 0 0 0 | 2, 5 | 30, 56 |
| ... | ... | ... |
| 1 1 1 1 1 1 1 | 36, 128 | 251, 8,568 |

Algorithm 1 Pseudo-code for proposed decoding method

1: // Initialize decision-bits
2: $\bar{\bar{x}} \leftarrow \bar{y}$
3: // Initialize syndrome to 0 vector
4: for all $j \in [m]$ do
5: $\quad \bar{s}_j \leftarrow \bar{0}$
6: // Compute syndrome based on initial decisions
7: for all $k \in [n]$ do
8: $\quad$ if $x_k = 1$ then
9: $\quad\quad$ for all $j \in M[k]$ do
10: $\quad\quad\quad \bar{s}_j \leftarrow \bar{s}_j \oplus S_j[k]$
11: // Perform up to $\ell_{max}$ iterations
12: for all $\ell \in [\ell_{max}]$ do
13: $\quad$ for all $k \in [n]$ do
14: $\quad\quad$ // Compute reliability of $k$-th code-bit
15: $\quad\quad i_k \leftarrow (x_k \oplus y_k) + \sum_{j \in M[k]} (\mathbb{1}\{k \in L_j[\bar{s}_j]\})$
16: $\quad\quad$ // Compare with threshold
17: $\quad\quad$ if $i_k > \theta_\ell$ then
18: $\quad\quad\quad$ // Update decision and syndromes
19: $\quad\quad\quad x_k \leftarrow x_k \oplus 1$
20: $\quad\quad\quad$ for all $j \in M[k]$ do
21: $\quad\quad\quad\quad \bar{s}_j \leftarrow \bar{s}_j \oplus S_j[k]$
22: $\quad$ if $\bar{s}_j = 0 \,\forall j \in [m]$ then
23: $\quad\quad$ // Decoding successful
24: $\quad\quad$ return $\bar{\bar{x}}$
25: // Decoding failed if $\ell_{max}$ iterations completed
26: return $\bar{\bar{x}}$

FIG. 6

BIT-FLIPPING DECODER FOR G-LDPC CODES WITH SYNDROME-DECODING FOR COMPONENT CODES

CROSS-REFERENCES TO RELATED APPLICATIONS

The present application claims priority to Provisional Application No. 62/553,008 entitled "BIT-FLIPPING DECODER FOR G-LDPC CODES WITH SYNDROME-DECODING FOR COMPONENT CODES," filed Aug. 31, 2017, which is assigned to the assignee hereof and expressly incorporated by reference herein in its entirety.

BACKGROUND

Data integrity is an important feature for any data storage device and data transmission. Use of strong error-correction codes (ECCs) is recommended for various types of data storage devices including NAND flash memory devices. ECCs are also frequently used during the process of data transmission.

Error correcting code (ECC) refers to codes that add redundant data, or parity data, to a message, such that the message can be recovered by a receiver even when a number of errors were introduced, either during the process of transmission, or storage. In general, the ECC can correct the errors up to the capability of the code being used.

Solid-state drives (SSDs) use multi-level NAND flash devices for persistent storage. However, the multi-level NAND flash devices can be inherently unreliable and generally need to use ECCs to allow dramatic increase in data reliability at the expense of extra storage space for ECC parity bits. There is a demand for increasingly efficient ECCs that provide the most data protection for the least parity requirements. Generalized low-density parity check codes (G-LDPC) are excellent candidates for use on binary-output channels like the NAND flash memory devices. However, if a G-LDPC decoder is designed to correct for the worst case correction capability, this decoder may not be fast enough and may have a high hardware complexity in terms of processing cycles and power consumption, especially that a significant amount of the errors to be corrected do not fall under this worst case. Hence, there is a need for low-complexity decoding schemes for G-LDPC codes that allow fast decoding for most NAND reads that have a few errors, without the hardware complexity of a decoder designed to correct for the worst case.

BRIEF SUMMARY

Techniques for improving the performance (e.g., reducing latency) of G-LDPC decoding while reducing the implementation cost (e.g., power consumption, processing cycles, etc.) relative to existing G-LDPC decoding systems are described. More specifically, systems and methods are described for improving the performance while reducing the implementation cost. In an example, a decoding system receives a G-LDPC codeword that includes a plurality of component codewords. The decoding system decodes the G-LDPC codeword by performing decoding operations. The decoding operations include identifying a component codeword that protects a bit of the G-LDPC codeword. The decoding operations also include updating a current syndrome of the component codeword based on a predefined syndrome from a first syndrome table. The predefined syndrome is determined from the first syndrome table based on a location of the bit in at least one of the component codeword or the G-LDPC codeword. The decoding operations also include performing a bit-flipping operation on the bit in the component codeword based on an error location from a second syndrome table. The error location is determined from the second syndrome table based on the current syndrome of the component codeword. The bit-flipping operation is performed based on a determination that the error location corresponds to the location of the bit.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIG. 3 illustrates example syndrome tables used in the decoding of G-LDPC codewords, in accordance with certain embodiments of the present disclosure.

FIG. 6 illustrates an example pseudocode for decoding LDPC codewords based on syndrome tables, in accordance with certain embodiments of the present disclosure.

DETAILED DESCRIPTION

Figure 1:
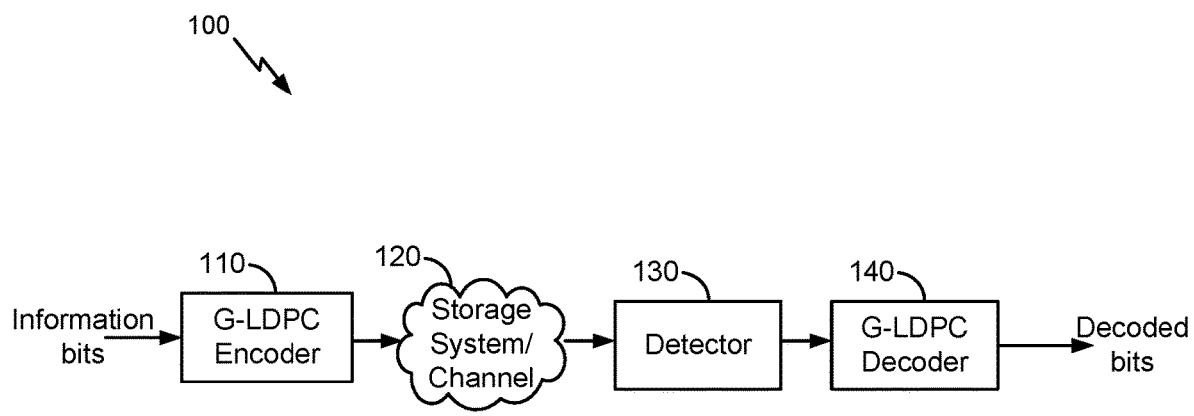
FIG. 1 illustrates an example high level block diagram of an error correcting system, in accordance with certain embodiments of the present disclosure.

Embodiments of the present disclosure involve improving the performance (e.g., reducing latency) of G-LDPC decoding while reducing the implementation cost (e.g., power consumption, processing cycles, etc.) relative to existing G-LDPC decoding systems are described. Whereas existing solutions implement a relatively slow, complex decoder (e.g., one designed for the worst case correction capability) for decoding any G-LDPC codeword regardless of the number of errors, the embodiments herein involve using a faster, less complex decoder to decode the G-LDPC codewords. Only when the decoding fails (e.g., the number of errors is beyond the error correction capability of the less complex decoder) is the slower, more complex decoder used (e.g., the one with the higher error correction capability). This translates into a fast and a low complex decoding scheme for correcting most errors. Hence, the overall performance in terms of decoding latency, power consumption, processing cycles, etc. of the G-LDPC decoding system is improved because the faster, lower complexity decoder is significantly more frequently used than the slower, higher complexity decoder.

In an example, the faster, less complex decoder uses two syndrome tables for the decoding of a G-LDPC codeword. The first syndrome table identifies a predefined syndrome for a component codeword of the G-LDPC codeword depending on a bit location. This syndrome table is referred to herein as an S-table. The second syndrome identifies a bit error location depending on a syndrome of the component codeword. This syndrome table is referred to herein as an L-table.

Upon receiving the G-LDPC codeword, a bit from the G-LDPC codeword is selected and component codewords that protect the bit are identified from the G-LDPC codeword. For each of these component codewords at a current decoding iteration, the location of the bit in the component codeword is used to look up the predefined syndrome from S-table for that location and the current syndrome of the component codeword is updated based on the predefined syndrome. Next, the reliability of the bit is updated based on the current syndromes, as updated, and based on the L-table. In particular, for each of the component codewords where the bit has a "1" value, the current syndrome of the component codeword is used to look-up the bit error location in the L-table and, if the bit error location is the same as the location of the bit in the component codeword, the reliability of the bit is increased by a value. If the reliability crosses a threshold, the bit is flipped. Because of the bit flipping, the current syndromes of the component codewords protecting this bit are further updated by using the S-table. If the current syndromes are equal to zero, the decoded value of the bit is outputted. Otherwise, the decoding is not successful yet for this bit and is repeated for other bits for the current iteration. The decoding of the bits that were not successfully decoded in the current iteration is repeated at a next iteration, until a maximum number of decoding iterations is reached. At that point, if any bit was not successfully decoded, the decoding of the bit is a failure. The slower, more complex decoder can be used for decoding such failed bits.

Many technical advantages for using the faster, lower complexity decoder exist. For example, its bit-flipping scheme relies on updating reliabilities of bits based on the S-table and the L-table. This scheme is much faster and less complex to perform than the typical bit-flipping scheme of the slower, more complex decoder. Hence, G-LDPC decoding system that implements both decoders would use the faster, less complex bit-flipping scheme at a high frequency and use the slower, more complex bit-flipping scheme only as needed. Accordingly, the overall latency, processing cycles, and power consumption of this decoding system are improved relative to an existing G-LDPC decoding system that only uses the slower, more complex bit-flipping scheme. Further, the overall error correction capability (e.g., in terms of bit error rate or code failure rate) is significantly similar between the two decoding systems. In other words and relative to the existing decoding system, there is no meaningful performance degradation in terms of bit error rate and code failure rate, but there is significant performance improvements in terms of latency, processing cycles, and power consumption.

FIG. 1 illustrates an example high level block diagram of an error correcting system 100, in accordance with certain embodiments of the present disclosure. In the example, G-LDPC codes are described in connection with data storage. However, the embodiments of the present disclosure are not limited as such. Instead, the embodiments similarly apply to other usage of G-LDPC codes including, for example, data transmission. The term "error correcting code (ECC)" is used herein to refer to a codeword that is generated by a process of adding redundant data, or parity data, to a message, such that it can be recovered by a receiver even when a number of errors are introduced, either during the process of transmission, or storage. Error-correcting codes are frequently used in communications, as well as for reliable storage in storage systems such as CDs, DVDs, hard disks, and random access memories (RAMs), flash memories, and the like. Error correcting codes can include generalized low density parity check codes (G-LDPC). An example of a G-LDPC codeword is further described in connection with FIG. 2.

As illustrated, a G-LDPC encoder 110 receives information bits that include data which is desired to be stored in a storage system 120. G-LDPC encoded data is output by the G-LDPC encoder 110 and is written to the storage 120.

In various embodiments, the storage 120 may include a variety of storage types or media such as (e.g., magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a G-LDPC decoder 140 which performs G-LDPC decoding using the decision and reliability information. A soft input decoder utilizes both the decision and the reliability information to decode the codeword. A hard decoder utilizes only the decision values in the decoder to decode the codeword. The decoded bits generated by the G-LDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

Figure 2:
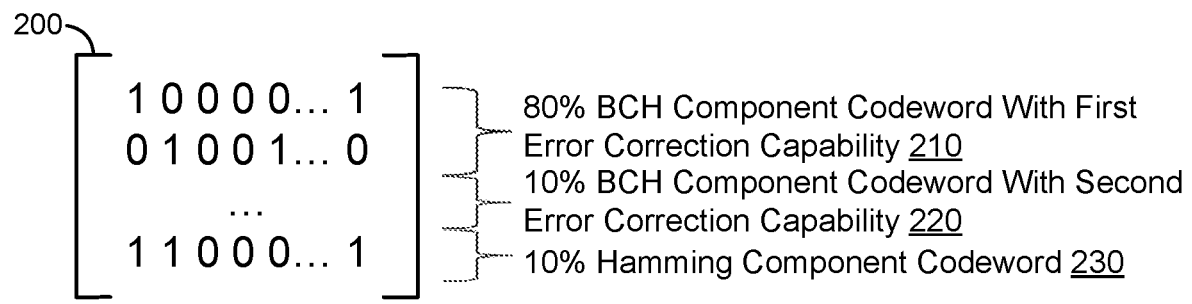
FIG. 2 illustrates an example parity-check matrix for a G-LDPC code, in accordance with certain embodiments of the present disclosure.

FIG. 2 illustrates an example parity-check matrix 200 for a G-LDPC code, in accordance with certain embodiments of the present disclosure. G-LDPC is a generalized LDPC code. LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to the number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

Generally, a G-LDPC code relaxes the constrains that are otherwise imposed on an LDPC code. For example, the bits (including information bits and parity bits) in a row of an LDPC parity check-matrix should meet a parity check equation. For G-LDPC code, the bits are protected by component codewords that form a G-LDPC codeword. The bits belonging to a component codeword should meet a parity check equation for that type of component codeword. Each bit of the G-LDPC codeword is protected by one or more component codewords, and these component codeword may, but need not, be of different types. For example, the G-LDPC codewords can be formed with Bose-Chaudhuri-Hocquenghem (BCH) codewords, Hamming codewords, Reed Solomon (RS) codeword, LDPC codewords, each having a particular error correction capability "t" (e.g., all BCH codewords with t=5), or with a combination of such codewords (e.g., a combination of BCH codewords with t=5, BCH codewords with t=7, Hamming codewords, etc.).

As illustrated in FIG. 2, the parity check matrix H 200 of the G-LDPC codewords includes "n" columns and "m" rows. The "n" columns correspond to the "n" bits of the G-LDPC codeword (e.g., to 9,000 information bits and a 1,000 parity bits). Each of the "m" rows corresponds to multiple short component codewords (e.g., includes 128 bit BCH component codeword). A value of "1" at an intersection between a column "k" and a row "j" in the parity check matrix H 200 (where "k" and "j" are positive integers smaller or equal to "n" and "m," respectively) indicates that the k-th bit of the G-LDPC code is protected by a component codeword in that j-th row. That k-th bit can take a value of "0" or "1" depending on the parity check equation of the component codeword that protects it.

For example, and as illustrated in FIG. 2, the G-LDPC codeword is made of 80% of BCH component codewords 210 with a first error correction capability, 10% of BCH component codewords 220 with a second error correction capability, and 10% of Hamming component codewords 230. Bit "$X_0$" of the G-LDPC code (e.g., the first bit) is associated with a "1" value in the first row j=0, with a "0" value in the second row j=1, and with the "1" value in the last row j=m−1. Accordingly, this bit "$X_0$" is protected by a first BCH component codeword 210 associated with the first row, by a Hamming component codeword 230 associated with the last row, but not with a second BCH component codeword 210 associated with the second row. "$X_{0,0}$" corresponds to the bit value in the first BCH component codeword 210 for the bit "$X_0$" of the G-LDPC codeword. "$X_{0,0}$" can be a "0" or a "1" depending on the parity check equation of the first BCH component codeword 210. Similarly, $X_{m-1,0}$" corresponds to the bit value in the Hamming component codeword 230 for the bit "$X_0$" of the G-LDPC codeword. "$X_{m-1,0}$" can be a "0" or a "1" depending on the parity check equation of the Hamming component codeword 230.

Further, the k-th bit of the G-LDPC codeword has a "k" location in the G-LDPC codeword. This location is referred to herein as the global location of the bit in the G-LDPC codeword. Each of the component codewords is much shorter than the G-LDPC codeword (e.g., 128 bits long or less). The k-th bit also has a particular location in a component codeword that protects it. This particular location is referred to herein as the local location of the bit in the component codeword. For instance, for k=2,345, the global location is 2,345 in the G-LDPC codeword and the local location can be 26 in the component codeword.

The global location is available from the parity check matrix H 200. For example, the global location corresponds to the column number. The local location is tracked based on the bits that are protected by a component codeword. For instance, if the component codewords protect bits in columns 3, 24, 36 (and other columns), the bit having a global location of 3 has a local location of 1, the bit having a global location of 24 has a local location of 2, the bit having a global location of 36 has a local location of 3, and so on and so forth. The value of the bits in the local locations of 1, 2, and 3 can be a "0" or a "1" depending on the parity check equation of the component codeword.

FIG. 3 illustrates example syndrome tables used in the decoding of G-LDPC codewords, in accordance with certain embodiments of the present disclosure. In particular, FIG. 3 illustrates an S-table 310 and an L-table 350. Example flows for generating these two syndrome tables are further described in connection with FIGS. 6 and 7.

The S-table 310 associates a predefined syndrome with a location of a bit. This association can be with a local location and/or a global location of the bit. In an example, the S-table 310 includes entries. One column lists the entries for the possible predefined syndromes. One column lists the entries for the possible local locations. And one column lists the entries for the possible global locations. A row in the S-table 310 covers three entries and identifies the association between a particular predefined syndrome in one of the three entries, a particular local location in another one of the three entries, and a corresponding global location in the remaining one of the three entries.

The L-table 350 associates a predefined syndrome with one or more error locations of one or more bits. This association can be with a local location of the bit that is in error and/or a global location of the bit that is in error. In an example, the L-table 350 includes entries. One column lists the entries for the possible predefined syndromes. One column lists the entries for the possible local bit error locations. And one column lists the entries for the possible global bit error locations. A row in the L-table 350 covers three entries and identifies the association between a particular predefined syndrome in one of the three entries, one or more particular local bit error locations in another one of the three entries, and one or more corresponding global bit error locations in the remaining one of the three entries.

Although FIG. 3 illustrates each of the syndromes tables as including three different columns, other table configurations are possible. For instance, each of the two tables may associate predefined syndromes with local locations or local bit error locations (as applicable). A mapping between the local locations and the global locations and a mapping between the local bit error locations and the global bit error locations may be stored separately from the two syndrome tables. Furthermore, the two syndrome tables may be stored as a single syndrome table (e.g., one that has three columns: a column identifying the predefined syndromes, a column for the local locations, and a column for the local bit error locations).

In an example, one or both syndrome tables can be generated on the fly by a decoding system. For instance, upon receiving a G-LDPC codeword, the decoding system may generate the syndrome tables as part of the decoding. In another example, one or both syndrome tables can be generated offline by a computer system and stored in storage space of the decoding system. For instance, once the G-LDPC coding structure is defined (e.g., the parity check matrix, the type(s) of component codewords, etc.) the computer system generates the syndrome tables. The syndrome tables are then imported to the storage space of the decoding system (e.g., local memory of the decoding system). Thereafter, once a G-LDPC codeword is received for decoding, the decoding system accesses the syndrome tables from its storage space in support of the decoding.

Although FIG. 3 describes only two syndrome tables, a larger number of tables can be defined. For example, an S-table and an L-table are defined for each type of component codeword. Referring back to the example of FIG. 2, the G-LDPC codeword there includes three types of component codewords. Accordingly, six syndrome tables can be generated (three S-tables and three L-tables, where each type of component codeword is associated with one of the three S-tables and one of the three L-tables).

Figure 4:
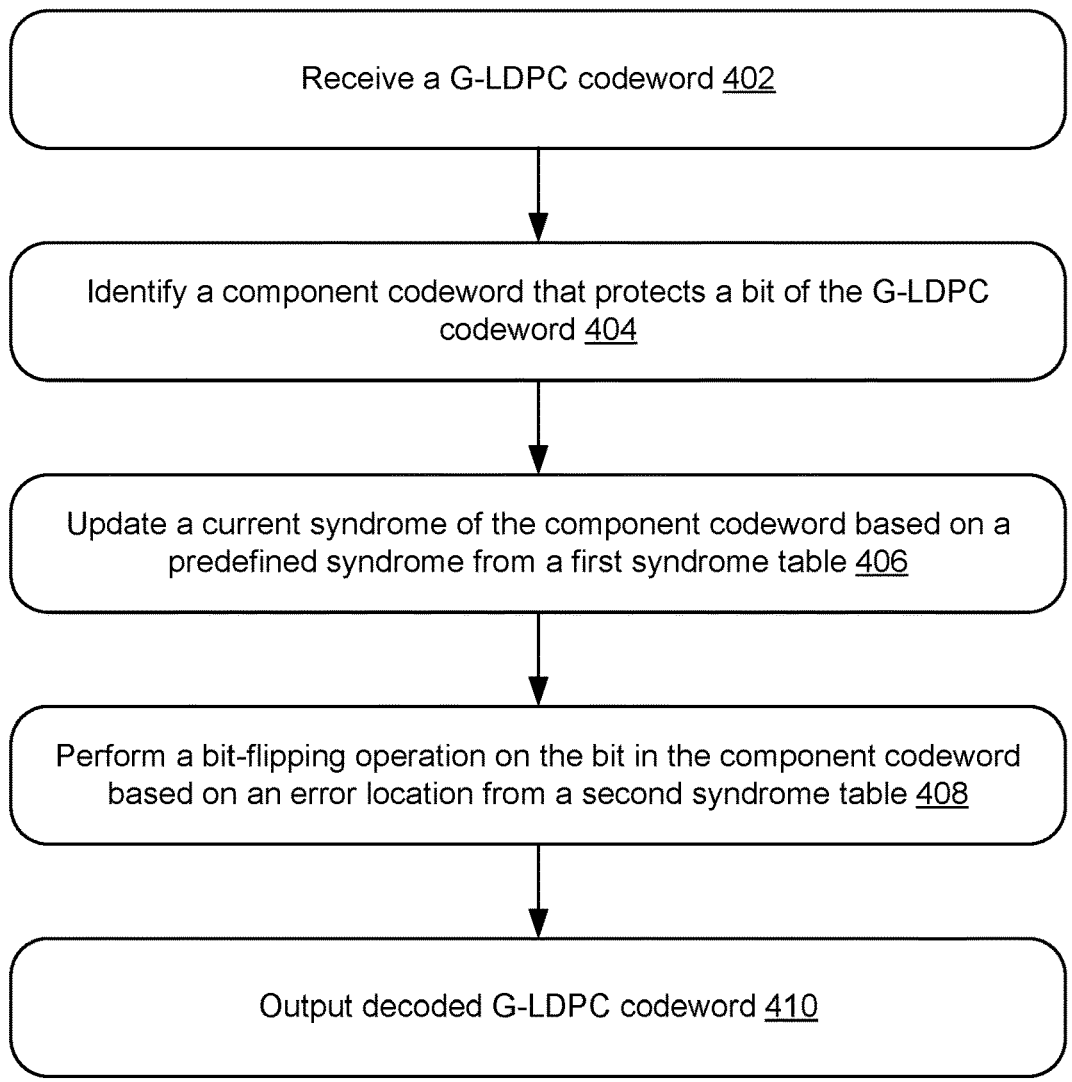
FIG. 4 illustrates an example flow for decoding LDPC codewords based on syndrome tables, in accordance with certain embodiments of the present disclosure.
Figure 5:
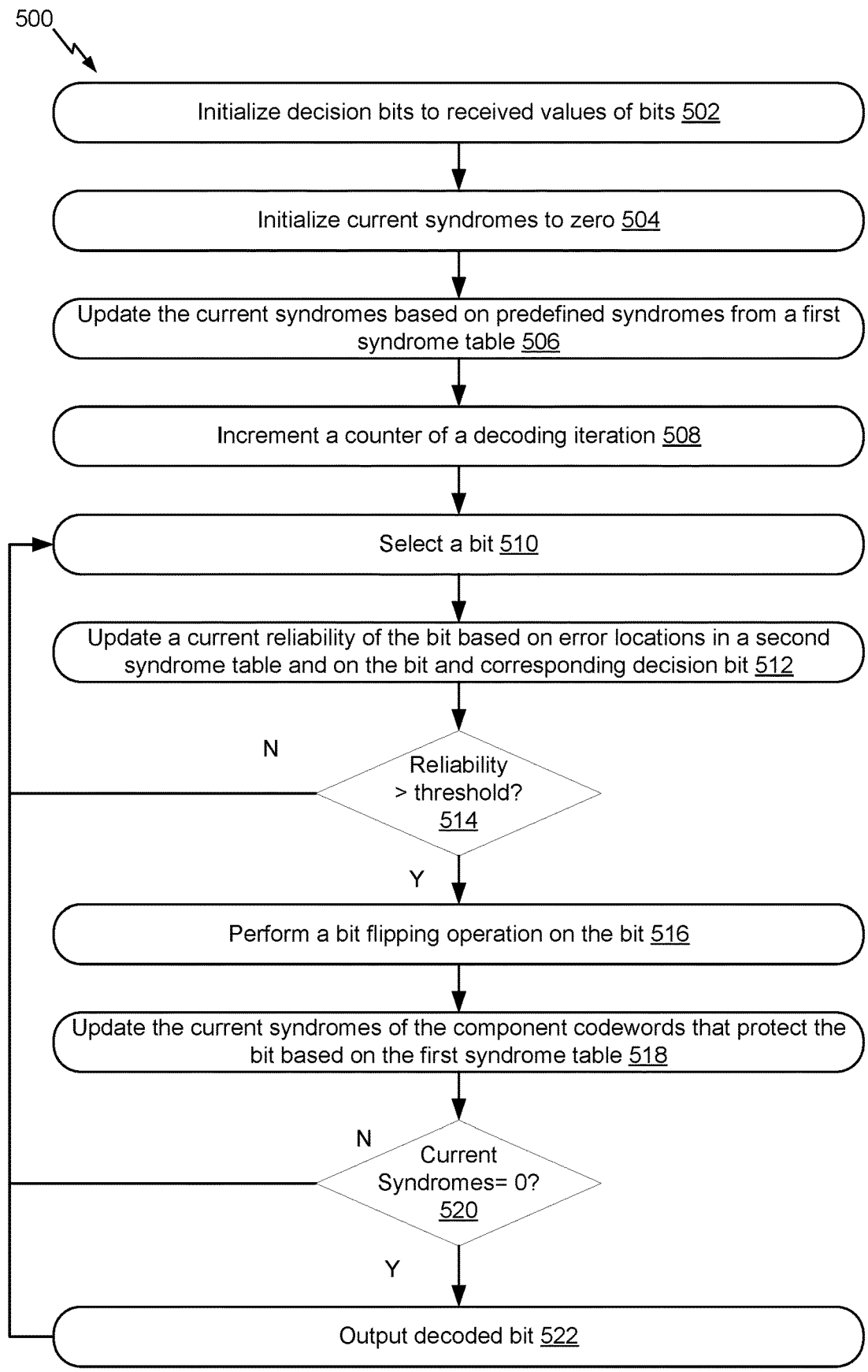
FIG. 5 illustrates a more detailed example flow for decoding LDPC codewords based on syndrome tables, in accordance with certain embodiments of the present disclosure.

FIGS. 4-5 illustrate example flows for a fast, low complexity bit-flipping decoding scheme for G-LDPC codewords, where this scheme uses an S-table and an L-table for each type of component codeword included in the G-LDPC codewords. A G-LDPC decoding system is described as performing particular operations of the example flows. In particular, this system can be implemented as part of an error correcting system that includes a decoder, such as the error correcting system 100 of FIG. 1. The G-LDPC decoding system may have a specific hardware configuration to perform some of operations of the error correcting system, including the operations of the decoder (e.g., one implementing the fast, low complexity bit-flipping decoding scheme). Alternatively or additionally, the G-LDPC decoding system may include generic hardware configured with specific instructions. In an example, the G-LDPC decoding system includes one or more processors and one or more memories. The memory(ies) stores computer-readable instructions to embody functionalities specific to the fast, low complexity bit-flipping decoding scheme. The instructions when executed by the processor(s) of the system result in performance of the functionalities by the system. The instructions stored in the memory(ies) in conjunction with the underlying processor(s) represent means for performing the functionalities. Although the operations are illustrated in a particular order, other arrangement of the operations are possible and some of the operations may be skipped as it would be apparent to a person skilled in the art. In the interest of clarity of explanation, the example flows are illustrated in connection with decoding a single G-LDPC codeword and focus on the decoding of a bit of this codeword. However, the example flows similarly apply to decoding all bits of the G-LDPC codeword and to a plurality of G-LDPC codewords. Furthermore, if the decoding fails, the decoding can be passed to a slower, more complex bit-flipping decoding scheme (e.g., one designed for a higher error correction capability).

FIG. 4 illustrates an example flow 400 for decoding LDPC codewords based on syndrome tables, in accordance with certain embodiments of the present disclosure. The example flow 400 starts at operation 402, where the decoding system receives a G-LDPC codeword. For example, the decoding system accesses the G-LDPC codeword from storage (e.g., the storage 120 of FIG. 1) to initiate the decoding. The G-LDPC codeword includes a plurality of component codewords. The component codewords may, but need not, be of a same type (e.g., different types of BCH codewords, Hamming codewords, RS codewords, LDPC codewords, etc.).

At operation 404, the decoding system identifies a component codeword that protects a bit of the G-LDPC codeword. For example, a subset of the plurality of component codewords can protect the bit based on a parity check matrix of the G-LDPC codeword. The decoding system identifies the component codeword from a subset based on the parity check matrix. For instance, the bit is the k-th bit in the GLPC codeword and the component codeword is in the j-th row of the parity check matrix. If the intersection of the k-th column with the j-th row is a one and belongs to the component codeword, then the decoding system identifies that the component codeword protects the bit.

At operation 406, the decoding system updates a current syndrome of the component codeword based on a predefined syndrome from a first syndrome table (e.g., an S-table associated with the type of the component codeword). For example, the decoding system determines the predefined syndrome from the first syndrome table based on a location of the bit in at least one of the component codeword or the G-LDPC codeword. In particular, the decoding system may identify a global location of the bit in the G-LDPC codeword (e.g., location "k") and/or the local location of the bit in the component codeword depending on the location columns of this table (e.g., if the table uses local but not global locations, the local location is identified. Conversely, if the table uses global but not local locations, the global location is identified). The decoding system retrieves the predefined syndrome from the first syndrome table by finding the entry corresponding to the location of the bit and reading the predefined syndrome from the corresponding entry in the syndrome column. Updating the syndrome includes multiplying the syndrome with the received value of the bit (e.g., a "0" or a "1") and performing an XOR operation on the current syndrome and the predefined syndrome (e.g., XOR'ing both syndromes).

At operation 408, the decoding system performs a bit-flipping operation on the bit in the component codeword based on an error location from a second syndrome table (e.g., an L-table). For example, the decoding system determines the error location from the second syndrome table based on the current syndrome of the component codeword. The bit-flipping operation (e.g., flipping the received value of the bit from a "0" to "1" or a "1" to "0") is performed based on a determination that the error location corresponds to the location of the bit. In particular, the decoding system retrieves the error location from the first syndrome table (e.g., global bit error location or local bit error location depending on the columns of the L-table) by finding the entry corresponding to the current syndrome of the component codeword and reading the error location(s) from the corresponding entry in the bit error location column. The decoding system compares this error location(s) with the location of the bit (e.g., the global bit error location with the bit's global location or the local bit error location with the bit's local location). If a match exist between the locations, the decoding system can determine that the bit should be flipped. Based on reliability of the bit (as further described in connection with FIG. 5), the bit is flipped and the current syndrome of the component codeword is subsequently updated.

At operation 410, the decoding system outputs a decoded G-LDPC codeword based on the bit being flipped. For example, the decoding system iteratively repeats the decoding of the bit and, similarly, the decoding of other bits of the G-LDPC codeword. In other words, the decoding system repeats operation 404-408, representing a decoding of G-LDPC codeword. If the decoding is successful (e.g., depending on syndrome values), the decoded bits are outputted. If the decoding of some bits is unsuccessful and a maximum number of decoding iterations is reached, the decoding system uses the slower, more complex bit-flipping decoding scheme to decode these bits.

FIG. 5 illustrates a more detailed example flow 500 for decoding LDPC codewords based on syndrome tables, in accordance with certain embodiments of the present disclosure. Some of the operations of the flow 500 are implemented as sub-operations of the example flow 400 of FIG. 4. Accordingly, similarities exist between the two flows 400 and 500. In the interest of brevity, the similarities are not repeated herein.

The example flow 500 starts at operation 502, where the decoding system initializes decision bits to received values of bits from a G-LDPC codeword. In an example, upon completing the decoding of the G-LDPC codeword, the decision bits are the decoded bits that the decoding system outputs. In this operation, each decision bit corresponds to a bit of the G-LDPC codeword. The received values are based on the read of the bits from the storage storing the bits. Accordingly, each decision bit is initialized to a value read for the corresponding bit.

At operation 504, the decoding system initializes current syndromes of the plurality of component codewords of the G-LDPC codeword to zero. For example, each current syndrome is a vector (or some array) of elements and corresponds to one of the component codewords. The decoding system sets the elements to zero in each of the vectors.

At operation 506, the decoding system updates the current syndromes based on predefined syndromes from a first syndrome table(s). For example, each current syndrome is associated with a component codeword that, in turn, is associated with an S-table. The predefined syndromes from the S-table(s) are used in the initialization. In particular and for a bit of the G-LDPC codeword, the decoding system identifies a set of component codewords of the plurality of component codewords, where the set protects the bit of the G-LDPC codeword. This set can include multiple component codewords (e.g., a first component codeword and a second component codeword) depending on how many component codewords of the G-LDPC codeword protect the bit. For each of these component codewords (e.g., for each of the first and second component codewords), the decoding system identifies a location of the bit of the G-LDPC codeword in the component codeword (e.g., a first local location of the bit in the first component codeword and a second location of the bit in the second component codeword), and updates a current syndrome of the component codeword based on a predefined syndrome determined from the first syndrome table given the location of the bit in the component codeword. For instance, for the first component codeword, the local location of the bit in this component codeword is used to retrieve from the relevant S-table the predefined syndrome. That predefined syndrome is multiplied with the value of the bit in the local location (e.g., a "0" value or a "1" value depending on the read of the first component codeword). The result of the multiplication is XOR'ed with the current syndrome of the first component codeword. In other words, if the current value of the bit is "1," the current syndrome and the predefined syndrome are XOR'ed. Otherwise, the current syndrome remains the same. This process is repeated to update the current syndrome of the second component codeword, and so on and so forth to update the current syndromes of all the component codewords that protect the bit. The same is also repeated for all other bits of the G-LDPC codeword.

At operation 508, the decoding system increments a counter of a decoding iteration. For example, the bit-flipping decoding of the G-LDPC codeword is iterative up to a maximum number of iterations. Hence, the decoding system starts at the first iteration and repeats the decoding until successful or until the maximum number is reached. The counter is used to track the current number of the decoding iteration. As such, if this was the l'th iteration, the counter is incremented by one from the previous value of "l−1" such that the counter becomes "l" for this decoding iteration.

At operation 510, the decoding system selects a bit of the G-LDPC codeword. In an example, the selection is sequential (e.g., the decoding system starts with decoding the first bit of the G-LDPC codeword, then the second bit, and so on and so forth up to the last bit in the G-LDPC codeword).

At operation 512, the decoding system updates a current reliability of the bit based on error locations in a second syndrome table (e.g., an L-table) and on the bit and corresponding decision bit. For example, the current reliability is initialized to zero prior to the start of the iterative decoding. At each decoding iteration, the current reliability is updated. In particular and for a particular component codeword that protects the bit, the updating includes adding a value (e.g., a one) to the current reliability based on the determination that the error location given the current syndrome of the component codeword corresponds to the location of the bit in the component codeword. In addition, the updating includes XOR'ing the bit with the decision bit corresponding thereto and adding the result (e.g., a "0" value if the two bits have the same value, a "1" value otherwise) to the current reliability. This process is repeated for all the component codewords that protect the bit and, thus, the current reliability is updated by adding the result of XOR'ing the decision bit and the bit, and adding a "1" value any time the L-table indicates that, for a current syndrome of one of these component codewords, the error location corresponds to the location of the bit in the component codeword.

For instance and for a second component codeword that protects the bit, the decoding system identifies the second component codeword, determines a second error location from the second syndrome table based on a current syndrome of the second component codeword, determines that the second error location corresponds to a location of the bit in the second component codeword, and adds the value (e.g., a one) to the current reliability based on the determination that the second error location corresponds to the location of the bit in the second component codeword.

Conversely, the decoding system identifies a third component codeword that protects the bit of the G-LDPC codeword, determines a third error location from the second syndrome table based on a current syndrome of the third component codeword, determines that the third error location is different from a location of the bit in the third component codeword, and avoids avoiding an addition of the value (e.g., a one) to the current reliability based on the determination that the third error location is different from the location of the bit in the third component codeword (e.g., the decoding system does not update the current syndrome or adds a zero value).

At operation 514, the decoding system compares the current reliability value to a threshold. If the comparison indicates that the current reliability is larger than the threshold, operation 516 is performed to flip the bit. Otherwise, the decoding system loops back to operation 510 and selects the next bit for decoding in the current decoding iteration.

Different techniques are possible to define the threshold. In an example, the threshold changes based on the counter of the decoding iteration. For instance, the threshold decreases with an increase to the counter of the decoding iteration. In each of the decoding iterations, the threshold is defined as a function of an error correction capability of the component codeword (e.g., as a percentage of the error correction capability). For example, for a BCH component codeword with an error correction capability of five, the threshold can be set as eighty percent (e.g., four) for the first ten decoding iterations, then sixty percent (e.g., three) for the next 5 decoding iterations, and so on and so forth. The specific percentages can be defined heuristically based on performance simulations of the decoding systems (e.g., simulating latency and error correction failures by varying the thresholds and selecting the ones that result in the desired latency and error correction failure performances).

At operation 516, the decoding system performs a bit flipping operation on the bit based on the current reliability of the bit being larger than the threshold at the decoding iteration. For example, the decoding system XOR's the decision bit corresponding to the bit with a "1" value. As such, if the decision bit was a "0," it is flipped to a "1" and vice versa.

At operation 518, the decoding system updates the current syndromes of the component codewords that protect the bit based on the first syndrome table(s) based on the bit being flipped and being protected by the component codewords. For example, because the bit was flipped, then the current syndrome of all these component codewords may need to be updated. To do so, the decoding system identifies the various component codewords that protect the bit. For each of these component codewords, the decoding system identifies the location of the bit in the component codeword (e.g., the local location), identifies a predefined syndrome for the component codeword from the corresponding S-table based on the location of the bit, and XOR's the current syndrome of the component codeword with this predefined syndrome. The result of the XOR operation is the updated current syndrome of the component codeword. This process is repeated for all the component codewords that protect the bit.

For instance, the decoding system identifies a second component codeword that protects the bit, determines a location of the bit in the second component codeword, determines for the second component codeword a second predefined syndrome from the first syndrome table (e.g., the S-table) based on the location of the bit in the second component codeword, and updates a second current syndrome of the second component codeword by performing the XOR operation on the second current syndrome and the second predefined syndrome determined for the second component codeword from the first syndrome table.

At operation 520, the decoding system determines whether all the current syndromes for the component code-words protecting the bit are zero at the current decoding iteration. If so, operation 520 is performed. Otherwise, the decoding of the bit was not successful at the current iteration and the decoding system loops back to operation 510 to select a next bit for the decoding of the G-LDPC codeword.

At operation 522, the decoding system outputs the decision bit (e.g., as flipped at operation 516) based on a determination that the current syndromes are a zero. In this case, the decoding of the bit is successful and the decoding of the G-LDPC codeword moves to the next bit. Accordingly, the decoding system loops back to operation 510 for the next bit.

Of course, for bits that were not successfully decoded in the current decoding iteration, the decoding system loops back to operation 508 by incrementing the counter. If the counter does not exceed the maximum number of decoding iterations, operations 510-522 are then repeated to decode the bits that were not successfully decoded in the previous decoding iteration. If the counter exceeds the threshold, the decoding of these bits is declared to have failed.

FIG. 6 illustrates an example pseudocode 600 for decoding LDPC codewords based on syndrome tables, in accordance with certain embodiments of the present disclosure. The pseudocode 600 corresponds to the operations described in connection with the example flow 500 of FIG. 5. The following notations are used in the pseudocode 600:

(1) m is the number of component codewords in a G-LDPC codeword;

(2) n is the total number of code-bits in the G-LDPC code-word;

(3) M[k] denotes the set of component codewords to which the k-th code-bit belongs;

(4) $\bar{s}_j$ denotes the syndrome-vector corresponding to the j-th check node;

(5) $L_j$ denotes the j-th syndrome-decoding table, e.g., given the syndrome-vector of the j-th component codeword $\bar{s}_j$ $L_j[\bar{s}_j]$ is the set of the code-bits that must be flipped to decode that component codeword;

(6) $S_j$ denote the j-th syndrome-encoding table, e.g., given code-bit k, the corresponding syndrome-vector of the component codeword is $S_j[k]$;

(7) $1_{max} \in \mathbb{N}$ is the maximum number of iterations;

(8)

$$\bar{y} \in \mathbb{F}_2^n$$

is the channel output (binary vector);

(9)

$$\bar{x} \in \mathbb{F}_2^n$$

is the current decision for all code-bits (binary vector);

(10) [t] denotes the set {1, 2, 3, : : : , t} for any t∈ $\mathbb{N}$ ; and

(11) $\theta_l \in \mathbb{N}$ is the threshold for l-th iteration.

Figure 7:
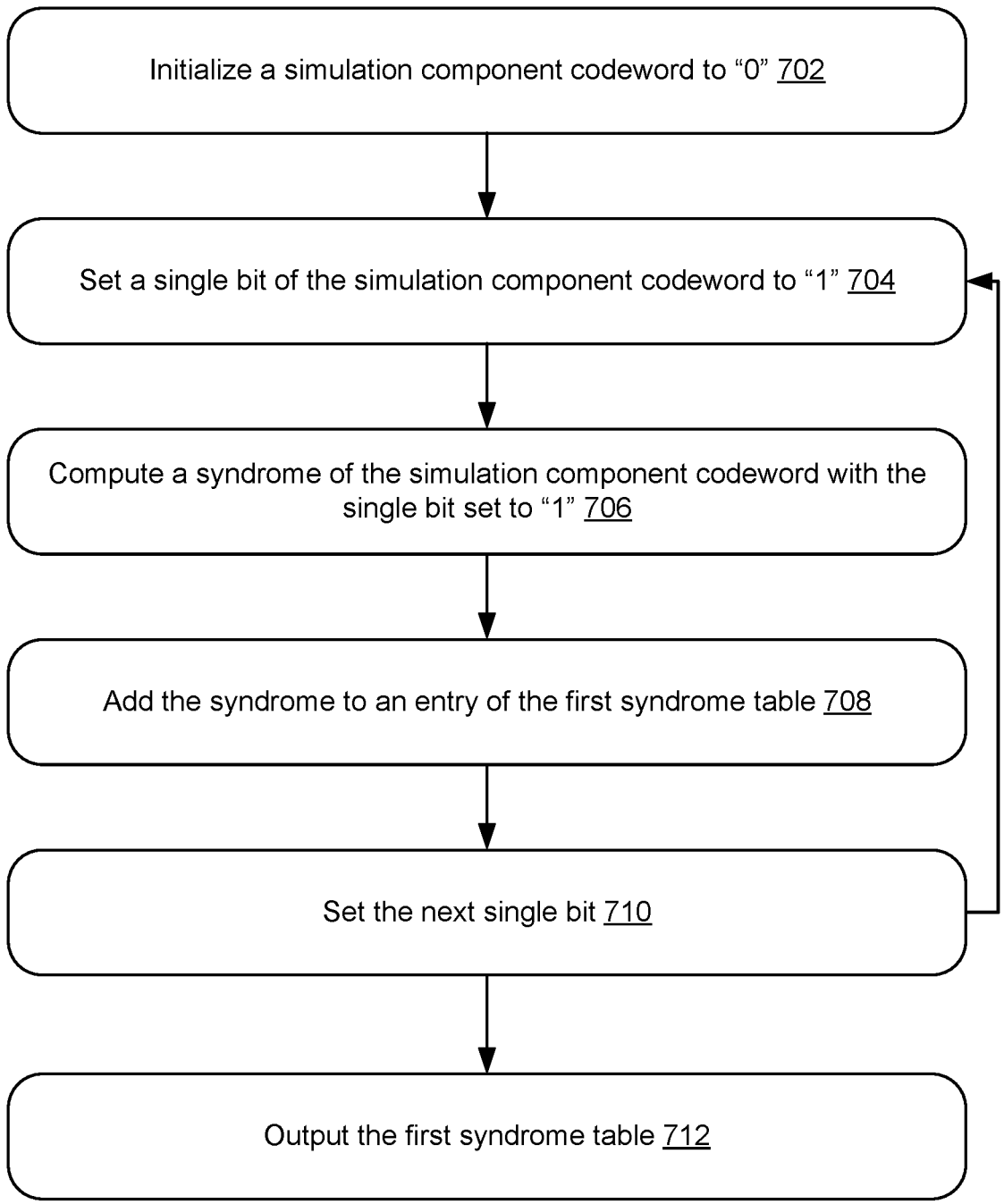
FIG. 7 illustrates an example flow for defining a first syndrome table, in accordance with certain embodiments of the present disclosure.
Figure 8:
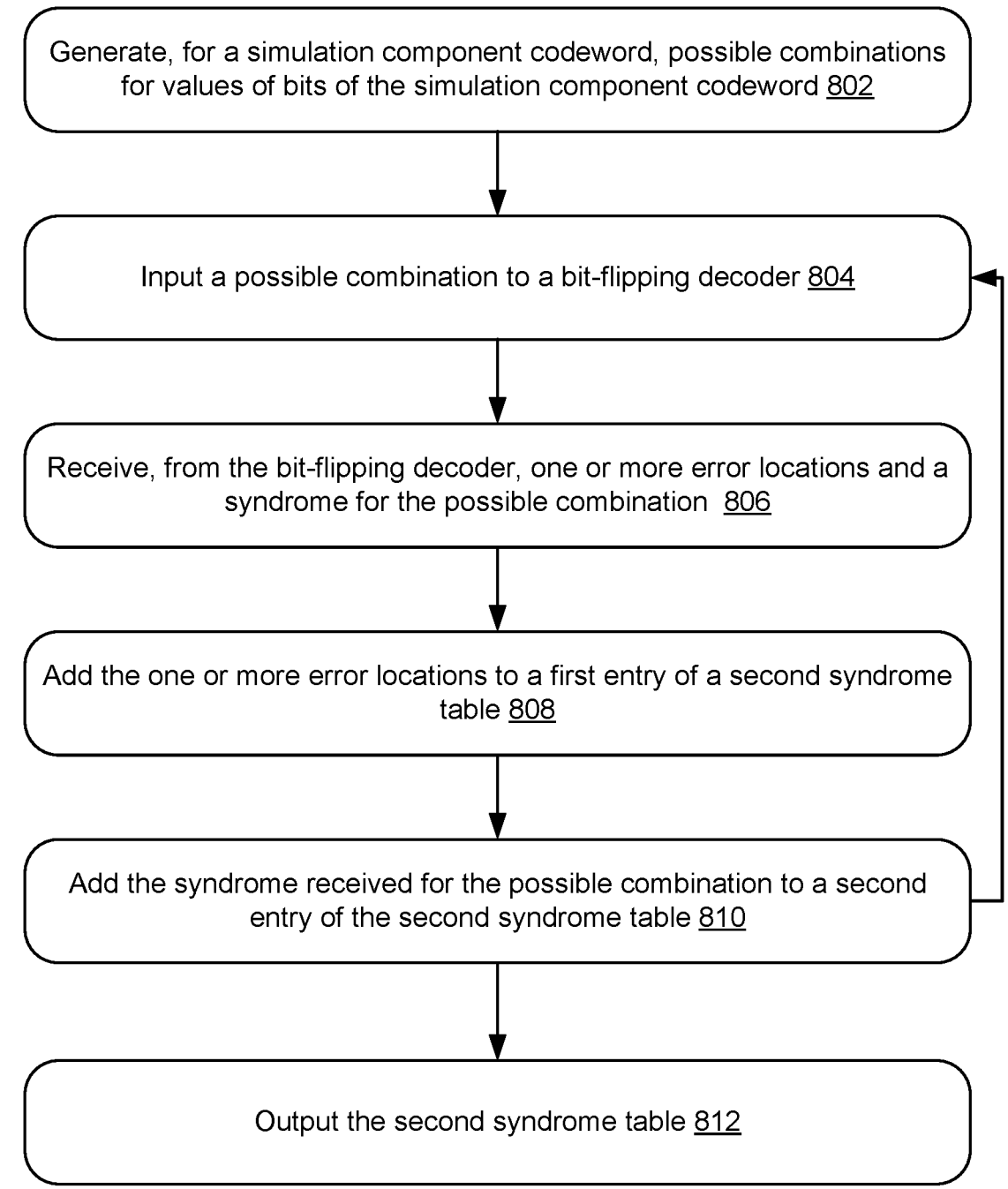
FIG. 8 illustrates an example flow for defining a second syndrome table, in accordance with certain embodiments of the present disclosure.

FIGS. 7-8 illustrate example flows for defining S-tables and L-tables. A computer system is described as performing particular operations of the example flows. In particular, this system can be an offline system (e.g., within a lab simulation environment) such that the syndrome tables are developed offline and then stored in a decoding system. Alternatively, the computer system can be the decoding system itself such that the syndrome tables are generated on the fly. In both cases, the computer system may have a specific hardware configuration to perform operations of the example flows. Alternatively or additionally, the computer system may include generic hardware configured with specific instructions. In an example, the computer system includes one or more processors and one or more memories. The memory(ies) stores computer-readable instructions to embody functionalities specific to the operations of the example flows. The instructions when executed by the processor(s) of the system result in performance of the functionalities by the computer system. The instructions stored in the memory(ies) in conjunctions with the underlying processor(s) represent a means for performing the functionalities. Although the operations are illustrated in a particular order, other arrangement of the operations are possible and some of the operations may be skipped as it would be apparent to a person skilled in the art. In the interest of clarity of explanation, the example flows are illustrated in connection with a single S-table and a single L-table. However, the example flows similarly apply to generating a different number of syndrome tables, where generally an S-table and an L-table are generated for each type of component codeword.

FIG. 7 illustrates an example flow 700 for defining a first syndrome table (e.g., an S-table), in accordance with certain embodiments of the present disclosure. The example flow 700 starts at operation 702, where the computer system initializes a simulation component codeword to "0. For example, the S-table should be generated for decoding G-LDPC codewords that include a particular type of component codewords (e.g., 128 bit BCH component codewords). Hence, the computer system generates a simulation component codeword according to the type of component codewords (e.g., a 128 bit BCH component codewords) and sets all the bits of this simulation component codewords to zeros.

At operation 704, the computer system sets a single bit of the simulation codeword to "1." For example, the computer system selects one of the bits and sets this bit to "1" while each of all the other bits remains a "0." The selection can be sequential (e.g., starting with the first bit, then the second bit, and so on and so forth). In other words, the selected bit has a particular location in the simulation component codeword such that, over the different selections, the locations of the selected bits span the entire simulation component codeword.

At operation 706, the computer system computes a syndrome of the simulation component codeword with the single bit set to "1." For example, the simulation component codeword has a parity check matrix. The syndrome is computed by multiplying the transpose of the parity check matrix with the simulation component codewords having the single bit set to "1."

At operation 708, the computer system adds the syndrome to an entry of the first syndrome table. This entry is associated with the location of the single bit in the simulation component codeword. For example, the S-table includes a location column and a syndrome column. The location column has an entry for the location of the bit. The computed syndrome is then stored in a corresponding entry in the syndrome column.

At operation 710, the computer system sets the next single bit to "1" and resets the current single bit to "0." In this way, only one bit at a time in the simulation component codeword can be a "1." The computer system then loops back to operation 704, to iteratively performing operations 704-708, such that the syndromes are computed by varying that single bit having a "1" value across the different bit locations of the simulation component codewords and updating the S-table to include the computed syndromes in association with these bit locations.

At operation 712, the computer system outputs the first syndrome table upon completing the syndrome computation and table updates for the different bit locations in the simulation component codeword. In an example, the table is sent to a storage space of a decoding system.

FIG. 8 illustrates an example flow 800 for defining a second syndrome table (e.g., an L-table), in accordance with certain embodiments of the present disclosure. The example flow 800 starts at operation 802, where the computer system generates, for a simulation component codeword, possible combinations for values of bits of the simulation component codeword. As described above in connection with the example flow 700 of FIG. 7, the simulation component codeword corresponds to a type of component codeword expected in G-LDPC codewords (e.g., a 128 bit BCH component codeword). In an example, the simulation component codeword has a particular length (e.g., a number of bits). The possible combinations correspond to the possible values that the bits of the simulation component codeword can take.

At operation 804, the computer system inputs a possible combination to a bit-flipping decoder (e.g., one that implements the bit-flipping decoding scheme described in connection with FIGS. 5 and 6). At operation 806, the computer system receives, from the bit-flipping decoder, one or more error locations and a syndrome for the possible combination.

At operation 808, the computer system adds the one or more error locations to a first entry of the L-table. For example, this entry is in a bit error location column of the L-table. At operation 810, the computer system adds the syndrome received for the possible combination to a second entry of the second syndrome table. For example, this entry is in a syndrome column of the L-table. The first entry and the second entry are associated together in the L-table (e.g., are in the same row). The computer system then loops back to operation 804, to iteratively performing operations 804-810, such that the various possible combinations are inputted to the bit-flipping decoder and the L-table is updated with entries corresponding to the bit error locations and associated syndromes.

At operation 812, the computer system outputs the second syndrome table (e.g., the L-table) upon completing the bit error location and syndrome determinations for the different possible combinations. In an example, the table is sent to a storage space of a decoding system.

Figure 9:
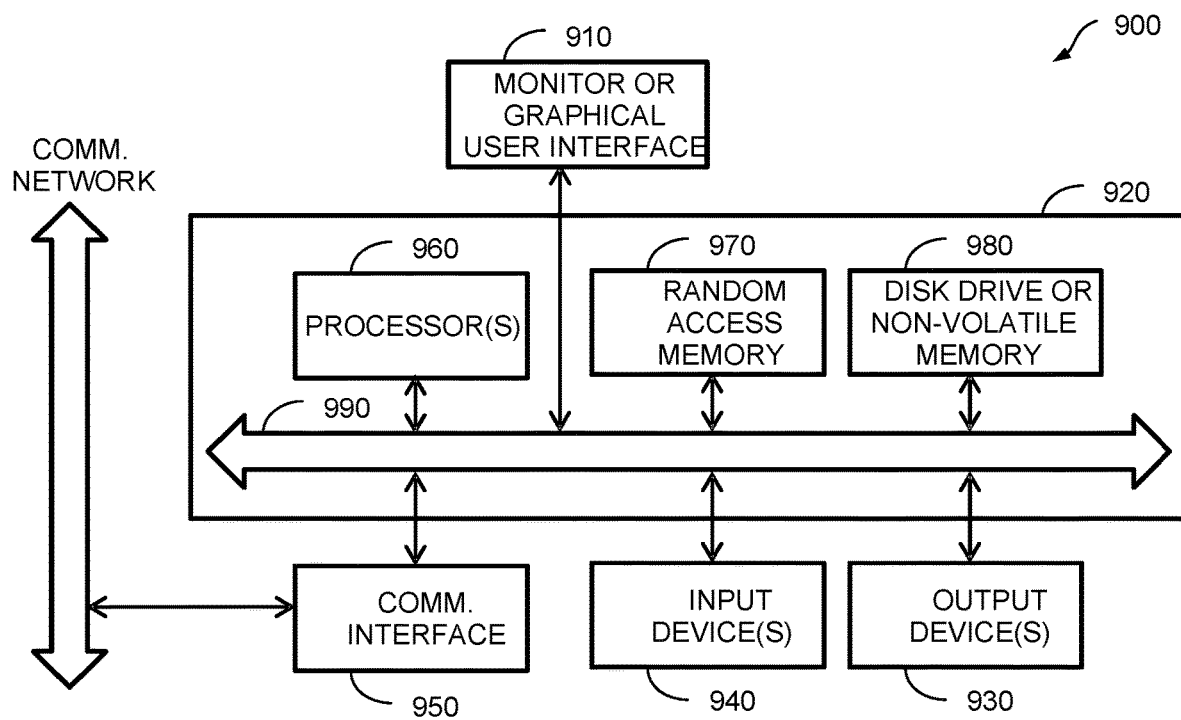
FIG. 9 describes one potential implementation of a system which may be used, in accordance with certain embodiments of the present disclosure.

FIG. 9 describes one potential implementation of a system which may be used, in accordance with certain embodiments of the present disclosure. FIG. 9 is merely illustrative of an embodiment of the present disclosure and does not limit the scope of the disclosure as recited in the claims. In one embodiment, the system is a computer system 900 that typically includes a monitor 910, a computer 920, user output devices 930, user input devices 940, communications interface 950, and the like.

As shown in FIG. 9, the computer 920 may include a processor(s) 960 that communicates with a number of peripheral devices via a bus subsystem 990. These peripheral devices may include the user output devices 930, the user input devices 940, the communications interface 950, and a storage subsystem, such as random access memory (RAM) 970 and disk drive 980.

The user input devices 930 include all possible types of devices and mechanisms for inputting information to the computer system 920. These may include a keyboard, a keypad, a touch screen incorporated into the display, audio input devices such as voice recognition systems, microphones, and other types of input devices. In various embodiments, the user input devices 930 are typically embodied as a computer mouse, a trackball, a track pad, a joystick, wireless remote, drawing tablet, voice command system, eye tracking system, and the like. The user input devices 930 typically allow a user to select objects, icons, text and the like that appear on the monitor 910 via a command such as a click of a button or the like.

The user output devices 940 include all possible types of devices and mechanisms for outputting information from the computer 920. These may include a display (e.g., the monitor 910), non-visual displays such as audio output devices, etc.

The communications interface 950 provides an interface to other communication networks and devices. The communications interface 950 may serve as an interface for receiving data from and transmitting data to other systems. Embodiments of the communications interface 950 typically include an Ethernet card, a modem (telephone, satellite, cable, ISDN), (asynchronous) digital subscriber line (DSL) unit, FireWire interface, USB interface, and the like. For example, the communications interface 950 may be coupled to a computer network, to a FireWire bus, or the like. In other embodiments, the communications interfaces 950 may be physically integrated on the motherboard of the computer 920, and may be a software program, such as soft DSL, or the like.

In various embodiments, the computer system 900 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 920 includes one or more Xeon microprocessors from Intel as the processor(s) 960. Further, one embodiment, the computer 920 includes a UNIX-based operating system.

The RAM 970 and the disk drive 980 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 970 and the disk drive 980 may be configured to store the basic programming and data constructs that provide the functionality of the present disclosure.

Software code modules and instructions that provide the functionality of the present disclosure may be stored in the RAM 970 and the disk drive 980. These software modules may be executed by the processor(s) 960. The RAM 970 and the disk drive 980 may also provide a repository for storing data used in accordance with the present disclosure.

The RAM 970 and the disk drive 980 may include a number of memories including a main random access memory (RAM) for storage of instructions and data during program execution and a read only memory (ROM) in which fixed non-transitory instructions are stored. The RAM 970 and the disk drive 980 may include a file storage subsystem providing persistent (non-volatile) storage for program and data files. The RAM 970 and the disk drive 980 may also include removable storage systems, such as removable flash memory.

The bus subsystem 990 provides a mechanism for letting the various components and subsystems of the computer 920 communicate with each other as intended. Although the bus subsystem 990 is shown schematically as a single bus, alternative embodiments of the bus subsystem may utilize multiple busses.

FIG. 9 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A generalized low density-parity check (G-LDPC) decoding method, comprising:
   receiving, by a decoding system, a G-LDPC codeword that comprises a plurality of component codewords; and
   decoding, by the decoding system, the G-LDPC codeword by at least:
   identifying a component codeword that protects a bit of the G-LDPC codeword;
   determining, from a first syndrome table, a predefined syndrome based on a location of the bit in at least one of the component codeword or the G-LDPC codeword, the first syndrome table associating the location with the predefined syndrome;
   updating a current syndrome of the component codeword based on the predefined syndrome;
   determining, from a second syndrome table, an error location based on the current syndrome, the second syndrome table associating one or more error locations with one or more syndromes; and
   performing a bit-flipping operation on the bit in the component codeword based on a determination that the error location corresponds to the location of the bit.

2. The method of claim 1, further comprising:
   initializing, by the decoding system, a decision bit of the G-LDPC codeword to the bit of the G-LDPC codeword;
   initializing, by the decoding system, current syndromes of the plurality of component codewords to zero; and
   updating, by the decoding system, the current syndromes by at least:
   identifying a set of component codewords of the plurality of component codewords, wherein the set protects the bit of the G-LDPC codeword and comprises the component codeword and a second component codeword; and
   for the second component codeword of the set:
   identifying a second location of the bit of the G-LDPC codeword in the second component codeword, and
   updating a current syndrome of the second component codeword based on a second predefined syndrome determined from the first syndrome table given the second location of the bit in the second component codeword.

3. The method of claim 2, wherein the current syndrome of the component codeword and the current syndrome of the second component codeword are updated based on the bit having a current value of "1."

4. The method of claim 1, further comprising:
   updating, by the decoding system, a current reliability of the bit by at least adding a value to the current reliability based on the determination that the error location given the current syndrome of the component codeword corresponds to the location of the bit in the component codeword.

5. The method of claim 4, wherein updating the current reliability comprises:
   identifying a second component codeword that protects the bit of the G-LDPC codeword;
   determining a second error location from the second syndrome table based on a current syndrome of the second component codeword;
   determining that the second error location corresponds to a location of the bit in the second component codeword; and
   adding the value to the current reliability based on the determination that the second error location corresponds to the location of the bit in the second component codeword.

6. The method of claim 5, wherein updating the current reliability further comprises:
   identifying a third component codeword that protects the bit of the G-LDPC codeword;
   determining a third error location from the second syndrome table based on a current syndrome of the third component codeword;
   determining that the third error location is different from a location of the bit in the third component codeword;
   avoiding an addition of the value to the current reliability based on the determination that the third error location is different from the location of the bit in the third component codeword.

7. The method of claim 6, wherein the value added to the current reliability is one.

8. The method of claim 4, wherein the current reliability is updated at a decoding iteration, and further comprising:
   comparing, by the decoding system, the current reliability at the decoding iteration to a threshold;
   performing, by the decoding system, the bit-flipping operation based on the comparing.

9. The method of claim 8, further comprising:
   updating, by the decoding system based on the bit being flipped and being protected by the component codeword, the current syndrome of the component codeword by performing an XOR operation on the current syndrome and the predefined syndrome determined for the component codeword from the first syndrome table;
   identifying, by the decoding system, a second component codeword that protects the bit of the G-LDPC codeword;
   determining, by the decoding system, a location of the bit in the second component codeword;
   determining, by the decoding system for the second component codeword, a second predefined syndrome from the first syndrome table based on the location of the bit in the second component codeword; and
   updating, by the decoding system based on the bit being flipped and being protected by the second component codeword, a second current syndrome of the second component codeword by performing the XOR operation on the second current syndrome and the second predefined syndrome determined for the second component codeword from the first syndrome table.

10. The method of claim 8, wherein the threshold changes based on a counter of the decoding iteration.

11. The method of claim 10, wherein the threshold decreases with an increase to the counter of the decoding iteration.

12. The method of claim 11, wherein the threshold is defined as a function of an error correction capability of the component codeword.

13. The method of claim 1, wherein the first syndrome table and the second syndrome table are stored as a single table in storage space of the decoding system.

14. A generalized low density-parity check (G-LDPC) decoding system comprising:
one or more processors; and
one or more memories communicatively coupled with the one or more processors and storing instructions that, upon execution by the one or more processors, configure the G-LDPC decoding system to at least:
receive a G-LDPC codeword that comprises a plurality of component codewords; and
decode the G-LDPC codeword by at least:
identifying a component codeword that protects a bit of the G-LDPC codeword;
determining, from a first syndrome table, a predefined syndrome based on a location of the bit in at least one of the component codeword or the G-LDPC codeword, the first syndrome table associating the location with the predefined syndrome;
updating a current syndrome of the component codeword based on the predefined syndrome;
determining, from a second syndrome table, an error location based on the current syndrome, the second syndrome table associating one or more error locations with one or more syndromes; and
performing a bit-flipping operation on the bit in the component codeword based on a determination that the error location corresponds to the location of the bit.

15. The G-LDPC decoding system of claim 14, wherein the first syndrome table is defined based on:
initializing a simulation component codeword to "0;" and iteratively performing operations comprising:
setting a single bit of the simulation component codeword to "1," wherein the single bit is at a location in the simulation component codeword;
computing a syndrome of the simulation component codeword with the single bit set to "1;" and
adding the syndrome to an entry of the first syndrome table, wherein the entry is associated with the location of the single bit in the simulation component codeword.

16. The G-LDPC decoding system of claim 14, wherein the second syndrome table is defined based on:
generating, for a simulation component codeword, possible combinations for values of bits of the simulation component codeword; and
for each possible combination, performing operations comprising:
inputting the possible combination to a bit-flipping decoder;
receiving, from the bit-flipping decoder, a set of error locations and a syndrome for the possible combination;
adding the one or more error locations to a first entry of the second syndrome table; and
adding the syndrome received for the possible combination to a second entry of the second syndrome table, wherein the first entry and the second entry are associated together.

17. One or more non-transitory computer storage media comprising instructions that, upon execution on a generalized low density-parity check (G-LDPC) decoding system, configure the G-LDPC decoding system to perform operations comprising:
receiving a G-LDPC codeword that comprises a plurality of component codewords; and
decoding the G-LDPC codeword by at least:
identifying a component codeword that protects a bit of the G-LDPC codeword;
determining, from a first syndrome table, a predefined syndrome based on a location of the bit in at least one of the component codeword or the G-LDPC codeword, the first syndrome table associating the location with the predefined syndrome;
updating a current syndrome of the component codeword based on the predefined syndrome;
determining, from a second syndrome table, an error location based on the current syndrome, the second syndrome table associating one or more error locations with one or more syndromes; and
performing a bit-flipping operation on the bit in the component codeword based on a determination that the error location corresponds to the location of the bit.

18. The one or more non-transitory computer storage media of claim 17, wherein the first syndrome table and the second syndrome table are generated by the G-LDPC decoding system after receiving the G-LDPC codeword.

19. The one or more non-transitory computer storage media of claim 17, wherein the first syndrome table and the second syndrome table are stored in a storage space of the G-LDPC decoding system prior to receiving the G-LDPC codeword, and wherein the first syndrome table and the second syndrome table are accessed by the G-LDPC decoding system from the storage space after receiving the G-LDPC codeword.

20. The one or more non-transitory computer storage media of claim 17, wherein the G-LDPC codeword comprises different types of component codewords, wherein the component codeword is of a first type of the different types, wherein the first syndrome table and the second syndrome table are defined for the first type, wherein a third syndrome table and a fourth syndrome table are defined for a second type of the different types, wherein the third syndrome table associates a syndrome with a bit location, and wherein the fourth syndrome table associates the syndrome with a corresponding error location.

\* \* \* \* \*